(12) United States Patent
Chen et al.

(10) Patent No.: US 6,587,368 B1
(45) Date of Patent: Jul. 1, 2003

(54) NON-VOLATILE MEMORY CIRCUIT

(75) Inventors: Shue-Shuen Chen, Yunlin Hsien (TW); Hsiang-Lan Lung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 4 days.

(21) Appl. No.: 10/036,361

(22) Filed: Jan. 7, 2002

(51) Int. Cl.[7] ............................................... G11C 11/24
(52) U.S. Cl. ........................ 365/149; 365/156; 365/149
(58) Field of Search ................................. 365/145, 149, 365/154, 156

(56) References Cited

U.S. PATENT DOCUMENTS

| | | | | |
|---|---|---|---|---|
| 4,918,654 A | * | 4/1990 | Eaton et al. | 365/145 |
| 5,218,566 A | * | 6/1993 | Papaliolios | 365/145 |
| 5,361,224 A | * | 11/1994 | Takasu | 365/145 |
| 5,751,627 A | * | 5/1998 | Ooishi | 365/145 |
| 6,285,575 B1 | * | 9/2001 | Miwa | 365/145 |

* cited by examiner

Primary Examiner—Son T. Dinh

(57) ABSTRACT

A memory circuit has a volatile memory portion and two ferroelectric capacitors. The volatile memory portion has two internal nodes and the ferroelectric capacitors are coupled in series to form a common node and two extreme poles. One of the two internal nodes is connected to the common node and the two poles couple with two plates lines, respectively. The polarization of the two capacitors is used to store the volatile memory portion data. When power is lost from the memory circuit, the last data state of the two internal nodes is stored into the ferroelectric capacitors. When power is applied to the memory circuit again, one of the two ferroelectric capacitors changes its polarization state and has a larger capacitance, which results in the voltage difference in the two internal nodes so that the last data state can be restored to the volatile memory portion.

15 Claims, 6 Drawing Sheets

NON-VOLATILE MEMORY CIRCUIT

FIELD OF THE INVENTION

The present invention relates to a memory circuit, and more particularly relates to a non-volatile memory circuit.

BACKGROUND OF THE INVENTION

Integrated circuit memories have come into extensive use in many applications, and particularly in computer systems. It has been a pronounced technological trend to increase the capacity and density of such memories. As manufacturing and design techniques have improved, the cost of memory circuits has decreased dramatically, and this has greatly expanded the number of applications and the size of the market. There are essentially two types of data memory devices used in computers today, "Nonvolatile" and "Volatile". Common nonvolatile memory devices include the well-known Read Only Memory (ROM) devices that include EPROM (erasable programmable ROM) devices, EEPROM (electrically erasable programmable ROM) devices, and Flash EEPROM devices. These nonvolatile memory devices maintain the data stored therein, even when power to the device is removed, and thus they are nonvolatile. Volatile memory devices include Dynamic Random Access Memory (DRAM) and Static Random Access Memory (SRAM) devices. RAM devices in the prior art have been used for temporary data storage, such as during data manipulation, since writing data into, and reading data out of, the device is performed quickly and easily. However, a disadvantage of these devices is that they require the constant application of power, such as in the form of a data refresh signal, to refresh and maintain data stored in the memory cells of the chip. Once power supplied to the device is interrupted, the data stored in the memory cells of the chip is lost.

SRAM having fast data access speed and long lifetime in all of the memory devices is suitable for use in computers, such as in BIOS.

FIG. 1 illustrates a circuit diagram of a conventional static RAM 100. The static AM 100 includes two n-channel MOS transistors 104, 105 and two p-channel MOS transistors 106, 107. A pair of nodes A and B is cross-coupled to the gate electrodes of MOS transistors 104 to 107 (flip-flop structure). This cross-coupled arrangement produces a regenerative effect which drive the nodes A and B to opposite voltage states. When one node is high the other is low. The circuit 100 therefore has two data states. A node C is set at the $V_{ss}$ level of zero volts. A further node D couples to a full $V_{dd}$ source. The source-drain paths of access MOS transistors 108 and 109 couple internal nodes A and B, respectively, to bit lines 102 and 103. The gate electrodes of access MOS transistors 108 and 109 are coupled to word line 101.

FIG. 2 illustrates a reading and writing waveform diagram of a static RAM 100. When writing logic "1" into the static RAM 100, the voltage state of word line 101 and bit line 102 keep in high level. The high state at node B causes MOS transistor 107 to be turned off and MOS transistor 105 to be turned on. This pulls node A to a low voltage state and bit line 103 is also in a low voltage state. The low state at node A permits MOS transistor 106 to be on while keeping MOS transistor 104 turned off. This further causes node B to be pulled to a high voltage state through MOS transistor 106. A logic "1" state for the static RAM 100 is arbitrarily defined to be node B high and node A low. When reading logic "1" from the static RAM 100, bit line 103 and 102 are first set in predetermined voltage state. Then, a high voltage is applied to the word line 101. At this time, the predetermined voltage state of bit line 103 is pulled down from MOS transistors 105 and 109. A data reading circuit (not shown in FIG. 2) detects a voltage difference between the bit lines 102 and 103 and enlarges the difference to read out the storing data, logic "1".

When writing logic "0" into the static RAM 100, the voltage state of word line 101 and bit line 103 are maintained at a high level. The high state at node A causes MOS transistor 106 to be turned off and MOS transistor 104 to be turned on. This pulls node B to a low voltage state and bit line 102 is also in a low voltage state. The low state at node B permits MOS transistor 107 to be on while keeping MOS transistor 105 turned off. This further causes node A to be pulled to a high voltage state through MOS transistor 107. A logic "0" state for the static RAM 100 is arbitrarily defined to be node A high and node B low. When reading logic "0" from the static RAM 100, bit lines 103 and 102 are first set in a predetermined voltage state. Then, a high voltage is applied to the word line 101. At this time, the predetermined voltage state of bit line 102 is pulled down from MOS transistors 104 and 108. A data reading circuit (not shown in FIG. 2) detects a voltage difference between bit lines 102 and 103 and enlarges the difference to read out the storing data, logic "0".

However, the low cost, large capacity static RAM circuits now in use have volatile memory storage, that is, the data stored in these memories is lost when the power is removed. There are many applications that could be enhanced if low cost memories could be made which were non-volatile. In certain applications, it is essential that the data be retained in the memory when power is removed. Therefore, an additional nonvolatile memory device, such as a hard disk, is needed to store data before power is turned off. If SRAM and nonvolatile memory device can be combined, the memory device will have both advantages of a SRAM and a nonvolatile memory device, such as fast data access, long lifetime and data retention. A nonvolatile SRAM would be useful and worthwhile. Therefore, from the foregoing, it can be seen that a need exists for non-volatile memory storage having low cost and high density of memory storage.

SUMMARY OF THE INVENTION

The conventional static RAMS, while having the advantage of being randomly accessible, have the disadvantage of being volatile. That is, when power is removed from the memories, the data dissipates. The voltage used to preserve the flip-flop states in the static RAM memory cells drops to zero so that the flip-flop loses its data. Therefore, the static RAMS according to the present invention uses ferroelectric capacitors for memory cells that have a significant advantage of being non-volatile. In normal operation, the memory circuit is fully function as a static RAM, and may be accessed quickly. After the power is turned off, the information stored in the volatile portion is copied into the ferroelectric capacitors. The memory circuit is a non-volatile memory circuit.

The ferroelectric capacitor includes a pair of capacitor plates with a ferroelectric material between them. A ferroelectric material has two different stable polarization states and can store the polarization state even though the applied voltage is removed. By assigning a binary zero to one polarization state and a binary one to the other polarization state, ferroelectric capacitors can be used to store binary information. Therefore, according to the present invention, the data of the static RAMS is restored into the ferroelectric capacitors. The advantage of this arrangement is that even though power may be interrupted or removed from the memory, data will continue to be stored.

According to the present invention providing a new memory circuit design, a conventional static RAMS is combined with a ferroelectric capacitors circuit, with the resulting circuit having the advantages of non-volatile characteristics and fast, random writing and reading of data. The memory circuit according to the present invention comprises two MOS transistor circuits to form a CMOS flip-flop circuit and two ferroelectric capacitors. The two ferroelectric capacitors are coupled in series to form a common node C between the two ferroelectric capacitors, and two poles each correspond uniquely to only one respective ferroelectric capacitor. According to the preferred embodiment, both the MOS transistor circuits are composed of a P-type MOS transistor and a N-type MOS transistor. The two circuits each have respectively a common node A and B, wherein the two common nodes A and B are cross-coupled for producing differential voltage states at the two nodes, respectively. One of the two common nodes couples with the common node C of the two ferroelectric capacitors. The poles of the two ferroelectric capacitors in series are coupled to the two plate lines, respectively. The two ferroelectric capacitors are used to store the data in the volatile portion when power is removed from the memory circuit.

During a writing operation, the two different voltage levels are applied to the plate lines respectively to result in the voltage difference with the common node to permit ferroelectric capacitors to change polarization states to write into the data. To recall or restore the data from the two ferroelectric capacitors, approximately one half of Vcc is applied to the two common nodes A and B. Then, a Vcc voltage is applied across the two plate lines because the voltage at the plate line is opposite to the polarization state of the capacitor. One of the two ferroelectric capacitors therefore experiences a transition in polarization state. The ferroelectric capacitor having the polarization state transition exhibits the larger capacitance. A voltage that develops at the common node C depends upon the polarization state of the ferroelectric capacitors and the voltage is greater than Vcc/2 volts for one state and lower than Vcc/2 volts for the other polarization state. This situation causes the unbalanced condition of the two common nodes A and B, thereby reestablishing the previous data state in the memory circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one preferred embodiment about a non-volatile memory circuit. Skill artisans, upon acknowledging the embodiments, can apply the present invention to any kind of static, dynamic, or other type combined with a ferroelectric capacitor or circuit. When power is removed, the ferroelectric capacitor is written into so that the data stored in the memory cell is preserved in the ferroelectric capacitor despite the loss of power. Therefore, the memory circuit in accordance with the present invention takes advantage of ROM and RAM, which may randomly access data and preserve data after a power loss. The circuit may keep the static RAM characteristics for providing fast, reliable writing and reading of data. On the other hand, the ferroelectric capacitors do not occupy much area, and therefore do not affect the whole area.

Figure 1:
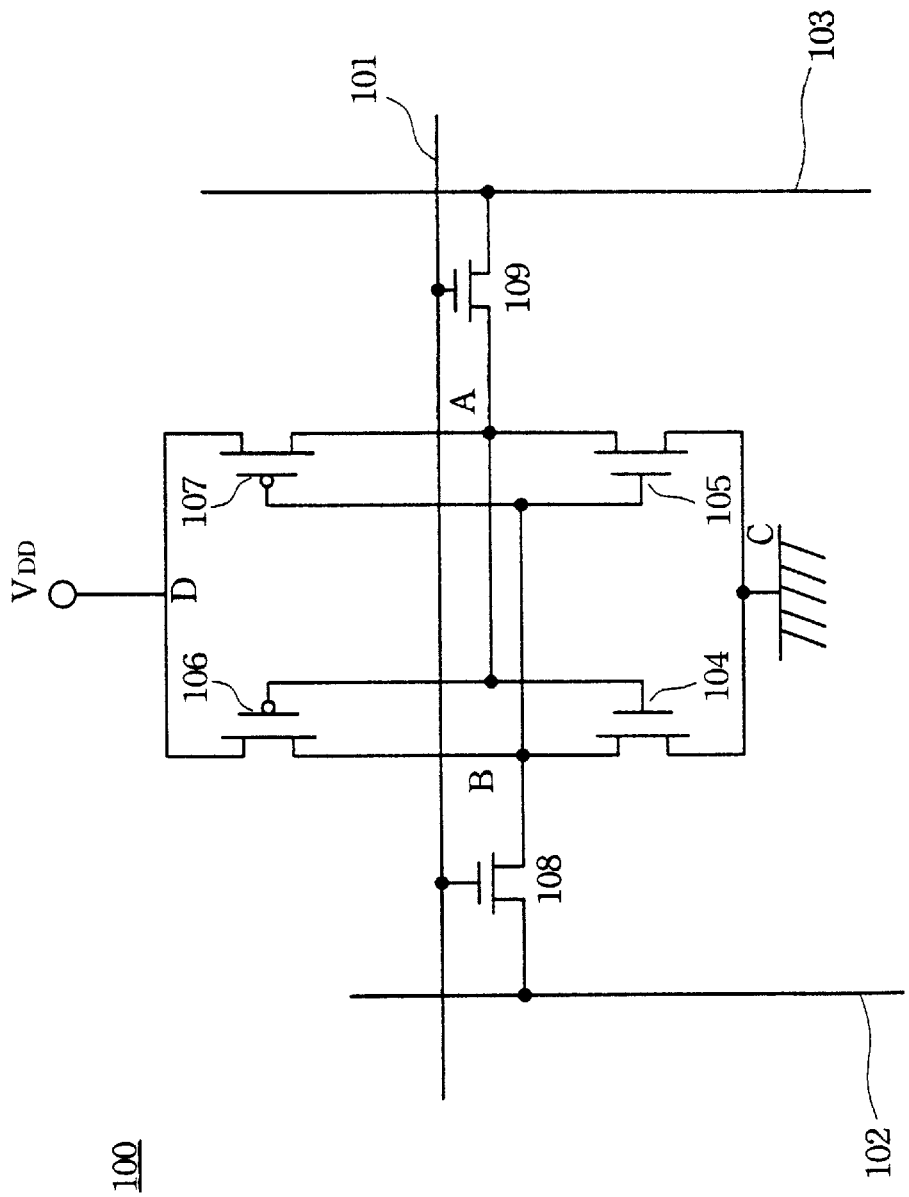
FIG. 1 is a schematic diagram of a conventional static RAMS circuit.
Figure 2:
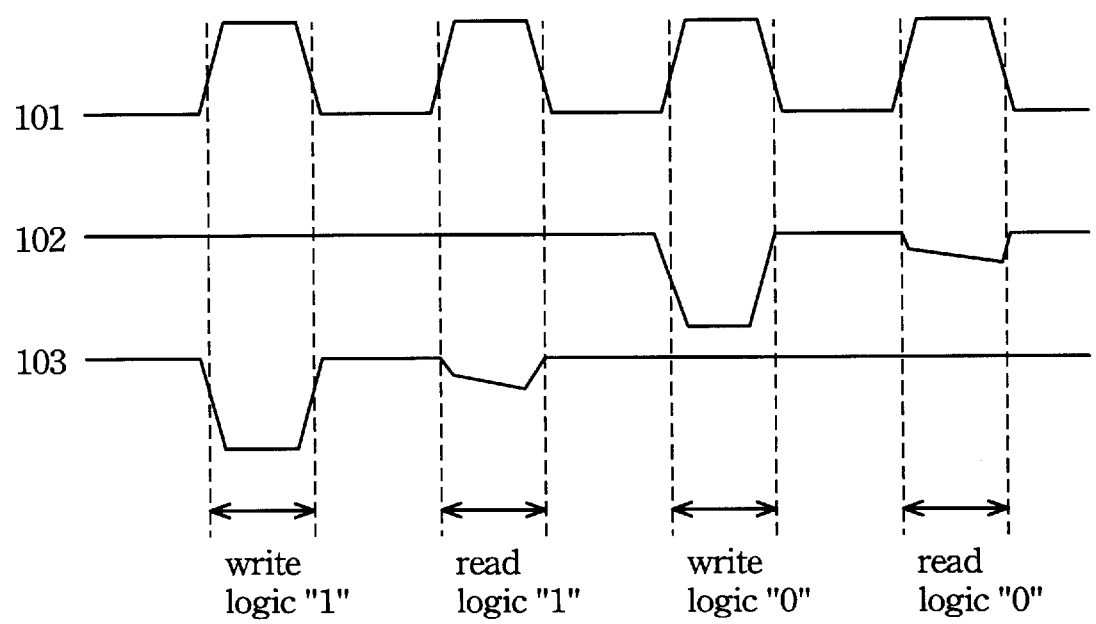
FIG. 2 illustrates a reading and writing waveform diagram of a static RAM.
Figure 3:
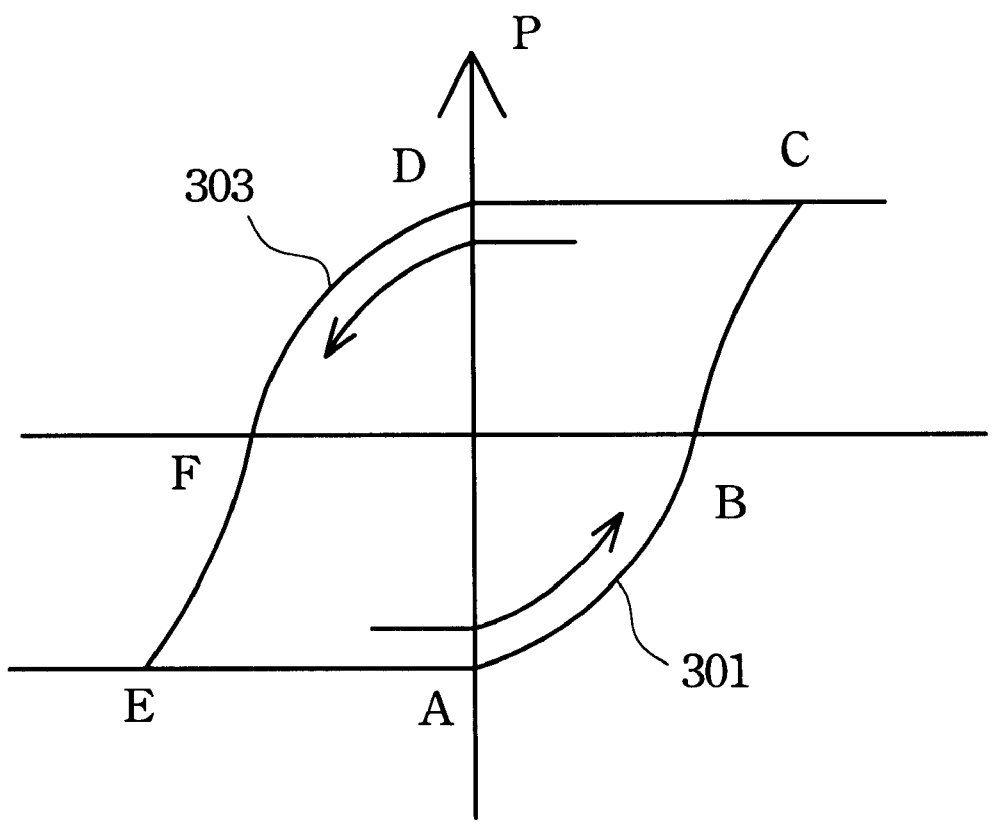
FIG. 3 is a hysteresis curve illustrating the polarization characteristics of a ferroelectric capacitor.

FIG. 3 illustrates a hysteresis curve of ferroelectrical material. The abscissa represents the field voltage applied to the material and the ordinate represents the polarization of the material. If a capacitor is formed using a ferroelectric material between its plates, because of the hysteresis curve, the flow of current through the capacitor depends on the prior history of the voltages applied to the device. If a ferroelectric capacitor is in a initial state on which zero volts are applied, point A or point D may indicate polarization. Assuming that point A in FIG. 1 indicates polarization, a positive voltage which is greater than the coercive voltage (referring to point B in FIG. 1) is applied across the capacitor, then the capacitor conducts current and has a new polarization (referring to point C in FIG. 1) state. When the applied voltage is removed, the ferroelectric capacitor maintains the same polarization state as shown at point D instead of returning to the state as shown at point A. A positive voltage continuously applied across the capacitor will causes a little change in the polarization. However, a sufficient negative voltage causes the polarization to vary from point D to point E as indicated in FIG. 1. Once the negative voltage is removed from the capacitor, the ferroelectric capacitor maintains the same polarization state and the curve moves to point A. Therefore, point A and point D respectively represent two different logical states when zero volts are applied across the capacitor. Therefore, from the foregoingdescription, the polarization states remain after the electric field is removed. The present invention uses this kind of characteristic of the ferroelectric capacitor to store data.

Figure 4:
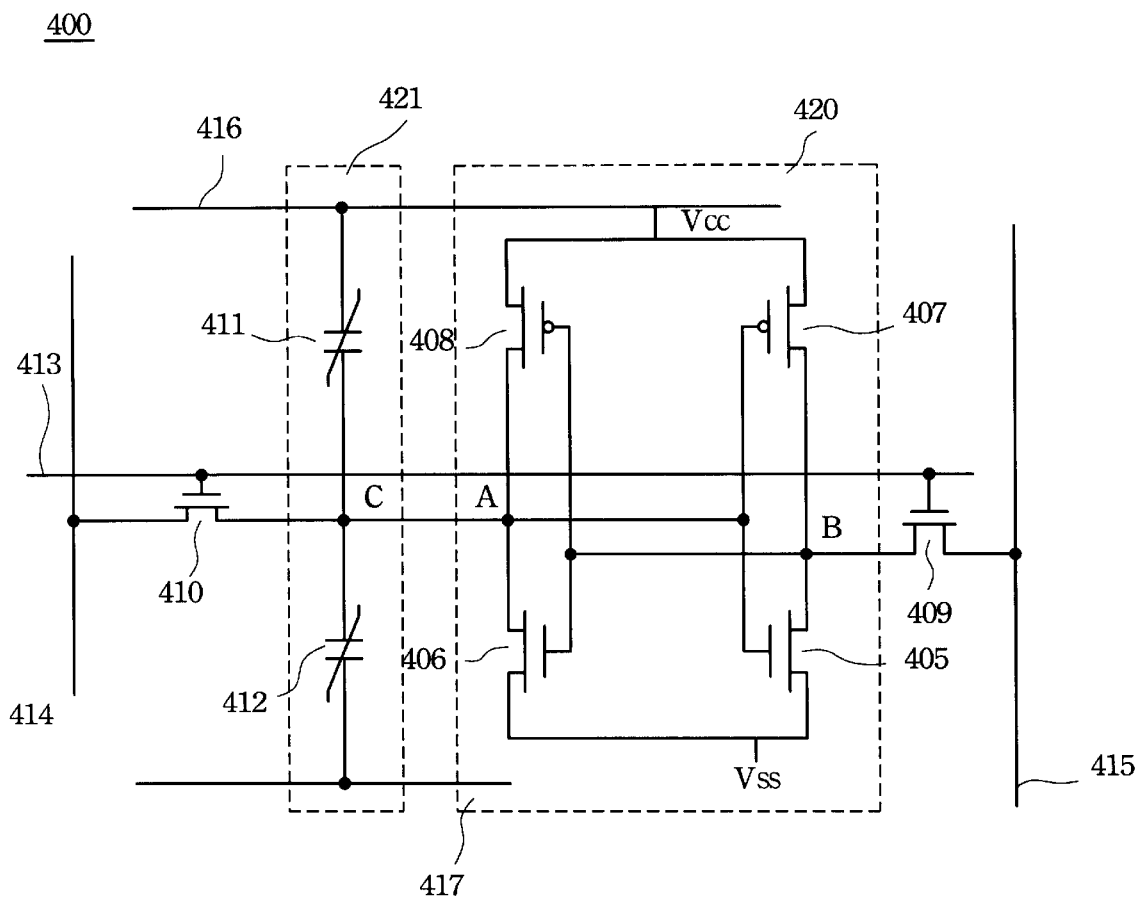
FIG. 4 is a schematic diagram of a non-volatile memory circuit in accordance with the present invention.

FIG. 4 is a schematic diagram of a non-volatile memory circuit 400 in accordance with the present invention. The non-volatile memory circuit 400 in accordance with the present invention is composed of a volatile memory portion 420 and non-volatile ferroelectric capacitor portion 421. The volatile memory portion 420 is a CMOS static RAM cell. However, it must be understood that such a memory cell is illustrative only and that other types of memory cell can be used. The CMOS static RAM cell includes two n-channel MOS transistors 405, 406 and two p-channel MOS transistors 407, 408. The gate terminals of MOS transistors 405 and 407 are connected to node A and the gate terminals of MOS transistors 406 and 408 are connected to node B. The pair of nodes A and B are cross-coupled to the gate electrodes of MOS transistors 405 to 408 (flip-flop structure). This cross-coupled arrangement produces a regenerative effect which drive the nodes A and B to opposite voltage states. When one node is high the other is low. The circuit 400 therefore may store two data states, logic "0" or logic "1".

On the other hand, the non-volatile ferroelectric capacitor portion 421 is formed by two ferroelectric capacitors 411 and 412. The two ferroelectric capacitors 411 and 412 are coupled in series to form a common node C between the two ferroelectric capacitors 411 and 412, and two poles each corresponding uniquely to only one respective ferroelectric capacitor. The two poles are connected to the plate lines 416 and 417, respectively. The common node C couples with one of the common nodes A, B. In accordance with the preferred embodiment of the present invention, the common node C is located between the common node A and the bit line 414. Therefore, the common node A is coupled via the source-drain paths of access transistor 410 to a bit line 414. The other common node B of the volatile memory portion 420 couples with another access transistor 409. Therefore, the common node B is coupled via the source-drain paths of access transistor 409 to a bit line 415. On the other hand, the gate terminals of access transistors 410, 409 are connected to a word line 413. During operation, a signal is input to the word line to turn on the access transistors 410, 409. The common nodes A, B of the volatile memory portion 420 may couple with the bit lines.

Figure 5:
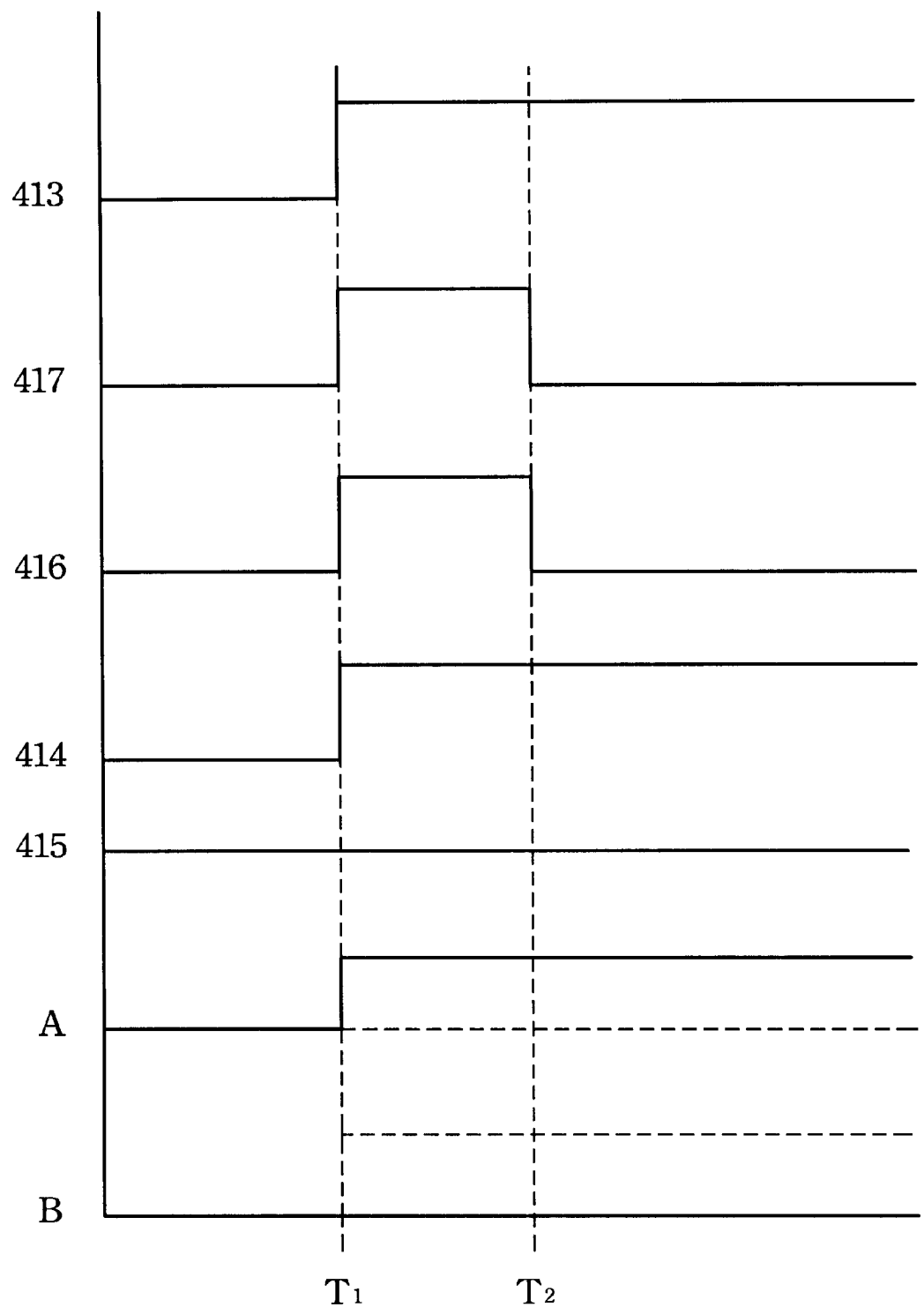
FIG. 5 illustrates a writing waveform diagram of a non-volatile memory circuit in accordance with the present invention.

FIG. 5 illustrates a writing waveform diagram of a non-volatile memory circuit in accordance with the present invention. The two states of the volatile memory portion 420 correspond to the data states 1 and 0. The data state of the volatile memory portion 420 can be set by inputting a high voltage to the word line 413 to turn on the access transistors 409 and 410, so that the common nodes A, B of the volatile memory portion 420 may be coupled to the bit lines. Assuming a high voltage is applied to the bit line 414, the node A is driven to a high state. The high state at node A causes MOS transistor 405 to be turned on and MOS transistor 407 to be turned off. This pulls node B to a low voltage state, Vss. The low state at node B permits MOS transistor 408 to be on while holding MOS transistor 406 turned off. This further causes node A to be pulled to a high voltage state, Vcc, through MOS transistor 408. A logic state for the volatile memory portion 420 is arbitrarily defined to be node A high and node B low as a shown line in FIG. 5.

On the other hand, assuming a low voltage is applied to the bit line 414, the node A is driven to a low state. The low state at node A causes MOS transistor 407 to be turned on and MOS transistor 405 to be turned off. This pulls node B to a high voltage state, Vcc. The high state at node B permits MOS transistor 406 to be on while keeping MOS transistor 408 turned off. This further causes node A to be pulled to a low voltage state, Vss, through MOS transistor 465. A logic state for the volatile memory portion 420 is arbitrarily defined to be node A low and node B high as a shown by the dotted line in FIG. 5. Therefore, logic "0" and logic "1" may be defined by these two states.

A logic data "1" state for the volatile memory portion 420 is arbitrarily defined to be the common node A high and common node B low. The non-volatile ferroelectric capacitor portion 421 is written into so that the data stored in the volatile memory portion 420 is preserved in the ferroelectric capacitor despite the loss of power. The writing method is that, at time T1, a high voltage is applied to the plate lines 416 and 417. Because the common node A is also at a high voltage level, the ferroelectric capacitors 411, 412 do not change the polarization states. At time T2, the voltage applied to the plate lines 416 and 417 are brought down but the common node A is also at a high voltage level. The ferroelectric capacitors 411, 412 therefore are driven to a polarization state. Assuming the polarization direction is from high voltage to low voltage, the polarization direction of the ferroelectric capacitor 411 is "up" and the polarization direction of the ferroelectric capacitor 412 is "down".

On the other hand, a logic data "0" state for the volatile memory portion 420 is arbitrarily defined to be the common node A low and common node B high. The non-volatile ferroelectric capacitor portion 421 is written into so that the data stored in the volatile memory portion 420 is preserved in the ferroelectric capacitor despite the loss of power. The writing method is that, at time T1, a high voltage is applied to the plate lines 416 and 417. Because the common node A is at a low voltage level, the ferroelectric capacitors 411, 412 are driven to a polarization state. If the polarization direction is the same as in the foregoing assumption, the polarization direction of the ferroelectric capacitor 411 is polarized "down" and the polarization direction of the ferroelectric capacitor 412 is polarized "up". Next, at time T2, the voltage applied to the plate lines 416 and 417 is brought down, which results in the plate lines 416, 417 and the common node A all being at a low voltage level. Therefore, the ferroelectric capacitors 411, 412 are kept at the same polarization states. The information in the volatile memory portion 420 is copied into the non-volatile ferroelectric capacitor portion 421. Therefore, the memory circuit 400 can be powered down without loss of information. Even though all voltages may drop to zero, the polarization states of capacitors 411 and 412 remain so that the information is preserved. It may be noted that while the user is free to continue normal operations of memory circuit 400, such normal operation can be reestablishing the previous data state in the memory circuit.

Figure 6:
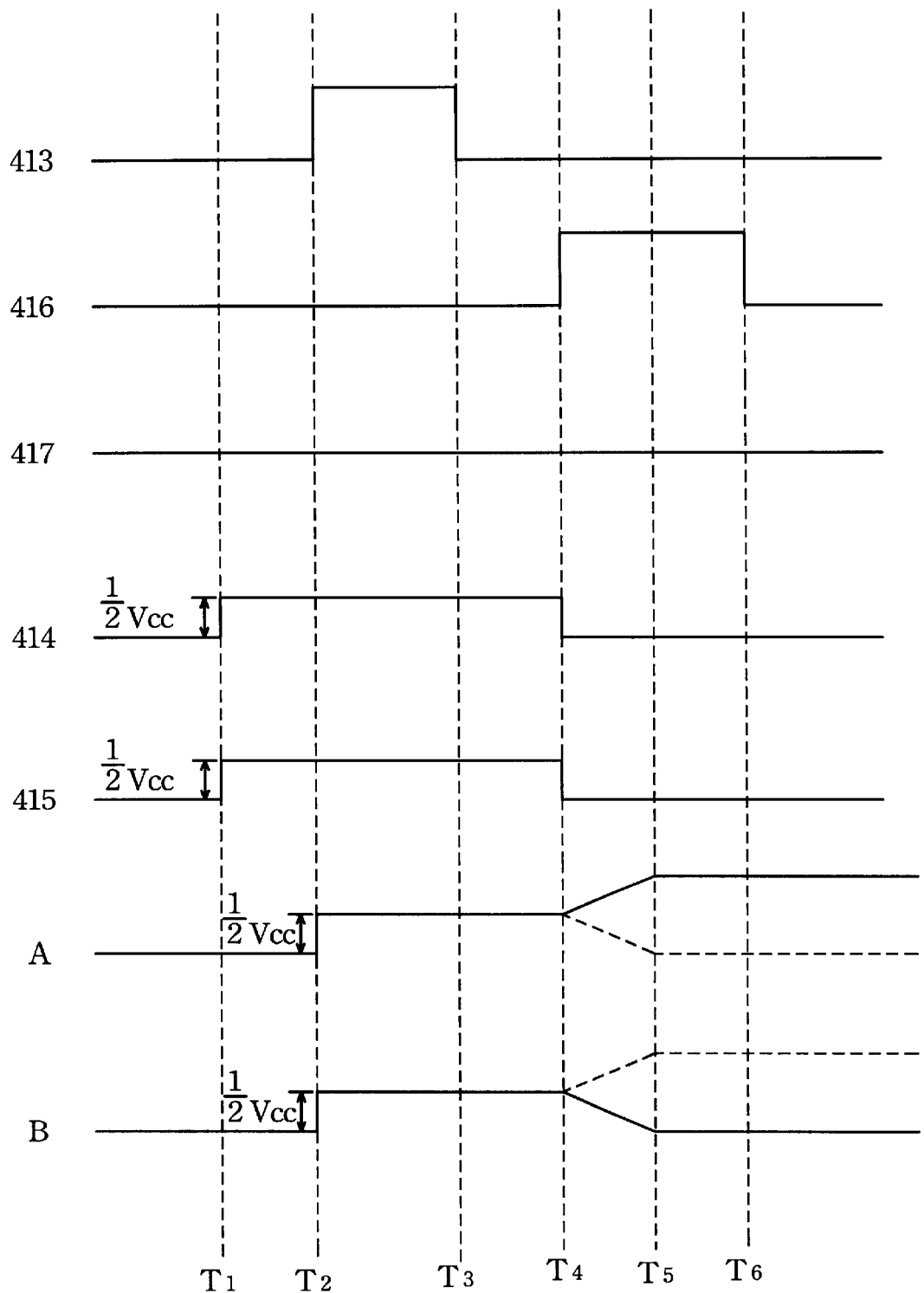
FIG. 6 illustrates a reestablished waveform diagram of a nonvolatile memory circuit in accordance with the present invention.

FIG. 6 illustrates a reestablishing waveform diagram of a nonvolatile memory circuit in accordance with the present invention. In accordance with the preferred embodiment, if memory circuit 400 has been powered down, the information stored in ferroelectric capacitors 411 and 412 can be restored to volatile memory portion 420 when power is restored. For the present example it is assumed that the memory circuit 400 restoring data has been set to a logic "1" state, node A high and node B low. Thus, the polarization direction of the ferroelectric capacitor 411 is "up" and the ferroelectric capacitor 412 is "down". When recalling or restoring the data, first, at time T1, the bit line 414 and 415 are precharged to 1/2 VccVoltage.

At time T2, a high voltage is applied to the word line 413 to turn on the access transistors 410 and 409, so that the common nodes A and B of the volatile memory portion 420 couple with the bit lines 414 and 415, respectively, via the source—drain path of the access transistors 410 and 409. Therefore, the voltage applied to bit lines 414 and 415 raises the common nodes A and B in voltage.

At time T3, the voltage applied to word line 413 is removed so that the access transistors 409 and 410 are turned off and the common nodes A and B voltage are kept in 1/2 Vcc.

At time T4, the voltages applied to the bit lines 414 and 415 are removed. A high voltage, Vcc, is applied to the plate line 416 as indicated by the rising waveform for Vcc in FIG. 6 and a low voltage (ground) is applied to the plate line 417. The common node A voltage is at 1/2 Vcc. If assuming the polarization direction is from high voltage to low voltage, the polarization direction of the ferroelectric capacitor 411 is polarized "down", which is different from the previous polarization direction. The polarization direction of the ferroelectric capacitor 412 is polarized "down", which is the same as the previous polarization direction. The ferroelectric capacitor 411 exhibits a larger capacitance than the capacitor 412 because the polarization direction changes. The two ferroelectric capacitors are in series; therefore, a voltage developed at the common node C depends upon the polarization state of the ferroelectric capacitors. The voltage at the common node C is greater than Vcc/2 volts, which brings up the common node A voltage. This situation causes the unbalanced condition of the two common nodes A and B.

At time T5, the flip-flop structure brings up the common node A to a high level and brings down the common node B (as shown in FIG. 6 dotted line), thereby reestablishing the previous data state in the volatile memory portion 420.

On the other hand, if the memory circuit 400 restoring data has been set to a logic "0" state, node A is low and node B is high. Thus, the polarization direction of the ferroelectric capacitor 411 is "down" and that of the ferroelectric capacitor 412 is "up". When recalling or restoring the data, the main difference with the foregoing description is at time T4.

At time T4, the voltages applied to the bit lines 414 and 415 are removed. A high voltage, Vcc, is applied to the plate line 416 and a low voltage (ground) is applied to the plate line 417. The common node A voltage is at 1/2 Vcc. If assuming the polarization direction is from high voltage to low voltage, the polarization direction of the ferroelectric capacitor 412 is polarized "down", which is different from the previous polarization direction. The polarization direction of the ferroelectric capacitor 411 is also polarized "down", which is same as the previous polarization direction. The ferroelectric capacitor 412 exhibits a larger capacitance than the capacitor 411 because of the polarization direction change. The two ferroelectric capacitors are in series; therefore, a voltage developed at the common node C depends upon the polarization state of the ferroelectric capacitors. The voltage at common node C is lower than Vcc/2 volts which brings down the common node A voltage. This situation causes the unbalanced condition of the two common nodes A and B. The flip-flop structure brings up the common node A to a high level and brings down the common node B (as shown in FIG. 6 line), thereby reestablishing the previous data state in the volatile memory portion 420.

As understood by a person skilled in the art, the foregoing preferred embodiments of the present invention are illustrative of the present invention rather than limiting of the present invention. The present invention is intended to cover various modifications and similar arrangements; for example, the volatile memory portion 420 may use other types of design using resistor or depletion MOS transistor to replace the P MOS transistor. All these are included within the spirit and scope of the appended claims, the scope of which should be accorded the broadest interpretation so as to encompass all such modifications and similar structure.

What is claimed is:

1. A non-volatile ferroelectric capacitor memory circuit, comprising:
    a volatile memory cell portion having a flip-flop configuration and having two internal nodes latched into complementary states during operation of said volatile portion;
    first and second ferroelectric capacitors having respective first and second plates, wherein said first plate of said first and second ferroelectric capacitors are coupled together to form a common node coupling with one of said two internal nodes;
    a first plate line coupling said second plate of said first ferroelectric capacitor; and
    a second plate line coupling said second plate of said second ferroelectric capacitor.

2. The memory circuit of claim 1, further including:
    a word line;
    first and second access transistors having respective gate electrodes coupling with said word line;
    a first bit line coupling with one of said two internal nodes via the source-drain path of said first access transistor; and
    a second bit line coupling with second one of said two internal nodes via the source-drain path of said second access transistor, whereby said memory circuit is selected when said word line turns on said first and second access transistors thereby to couple said first and second bit lines to said internal nodes, respectively.

3. The memory circuit of claim 1, wherein said complementary states exist when one of said internal nodes is high and a second one of said internal nodes is low.

4. The memory circuit of claim 1, wherein said first and second plate lines receive a voltage to polarize said first and second ferroelectric capacitors during writing and restoring cycles.

5. The memory circuit of claim 4, wherein said restoring cycle is a reestablishment of data stored in said first and second ferroelectric capacitors in said volatile memory cell portion when the power source is connected to said memory circuit again.

6. The memory circuit of claim 4, wherein polarizing said two ferroelectric capacitors during the writing cycle further comprises applying a high voltage to said first and second plate lines and subsequently applying a low voltage to said first and second plate lines.

7. The memory circuit of claim 4, wherein polarizing said two ferroelectric capacitors during the restoring cycle further comprises precharging said internal nodes of said volatile memory cell portion to a predetermined voltage and subsequently applying a high voltage to said first plate line and a low voltage to said second plate line.

8. The memory circuit of claim 7, wherein said predetermined voltage is half of the high voltage.

9. A non-volatile ferroelectric capacitor memory circuit, comprising:
    a word line;
    first and second access transistors having respective gate electrodes coupling with said word line;
    a volatile memory cell portion having a flip-flop configuration and having two internal nodes latched into complementary states during operation of said volatile portion and connected to said first and second access transistors, respectively;
    a first bit line coupling with one of said internal nodes via the source-drain path of said first access transistor;
    a second bit line coupling with second one of said internal nodes via the source-drain path of said second access transistor, whereby said memory circuit is selected when said word line turns on said first and second access transistors thereby to couple said first and second bit lines to said internal nodes, respectively;
    first and second ferroelectric capacitors having respectively first and second plates, wherein said first plates of said first and second ferroelectric capacitors are coupled together to form a common node coupling with one of said two internal nodes;
    a first plate line coupling said second plate of said first ferroelectric capacitor; and a second plate line coupling said second plate of said second ferroelectric capacitor.

10. The memory circuit of claim 9, wherein said complementary states exist when one of said internal nodes is high and a second one of said internal nodes is low.

11. The memory circuit of claim 9, wherein said first and second plate lines receive a voltage to polarize said first and second ferroelectric capacitors during writing and restoring cycles.

12. The memory circuit of claim 11, wherein said restoring cycle reestablishes data stored in said first and second ferroelectric capacitors in said volatile memory cell portion when the power source is connected to said memory circuit again.

13. The memory circuit of claim 11, wherein polarizing said two ferroelectric capacitors during writing cycle further comprises applying a high voltage to said first and second plate lines and subsequently applying a low voltage to said first and second plate lines.

14. The memory circuit of claim 11, wherein polarizing said two ferroelectric capacitors during restoring cycle further comprises precharging said internal nodes of said volatile memory cell portion to a predetermined voltage and subsequently applying a high voltage to said first plate line and a low voltage to said second plate line.

15. The memory circuit of claim 14, wherein said predetermined voltage is half of the high voltage.

* * * * *